United States Patent
Muramoto et al.

(10) Patent No.: US 11,602,878 B2
(45) Date of Patent: Mar. 14, 2023

(54) MASTER, TRANSFER COPY, AND METHOD FOR MANUFACTURING MASTER

(71) Applicant: DEXERIALS CORPORATION, Tokyo (JP)

(72) Inventors: Yutaka Muramoto, Tokyo (JP); Masanao Kikuchi, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 252 days.

(21) Appl. No.: 16/332,464

(22) PCT Filed: Sep. 5, 2017

(86) PCT No.: PCT/JP2017/031991
§ 371 (c)(1),
(2) Date: Mar. 12, 2019

(87) PCT Pub. No.: WO2018/051851
PCT Pub. Date: Mar. 22, 2018

(65) Prior Publication Data
US 2020/0198187 A1    Jun. 25, 2020

(30) Foreign Application Priority Data
Sep. 16, 2016    (JP) .............................. JP2016-181844

(51) Int. Cl.
*B29C 33/38*    (2006.01)
*B29C 33/42*    (2006.01)
(Continued)

(52) U.S. Cl.
CPC ........ *B29C 33/3878* (2013.01); *B29C 33/424* (2013.01); *B29C 59/04* (2013.01);
(Continued)

(58) Field of Classification Search
None
See application file for complete search history.

(56) References Cited

U.S. PATENT DOCUMENTS

| | | | | |
|---|---|---|---|---|
| 2014/0217449 A1* | 8/2014 | Yamaguchi | ............ | B82Y 10/00 257/98 |
| 2017/0205707 A1* | 7/2017 | Muramoto | .............. | C23C 16/44 |

FOREIGN PATENT DOCUMENTS

| | | |
|---|---|---|
| JP | 2008-209612 A | 9/2008 |
| JP | 2009-230132 A | 10/2009 |

(Continued)

OTHER PUBLICATIONS

Jun. 23, 2020, Japanese Office Action issued for related JP application No. 2016-181844.

(Continued)

*Primary Examiner* — Joshua D Zimmerman
(74) *Attorney, Agent, or Firm* — Paratus Law Group, PLLC

(57) ABSTRACT

There are provided a master and a method for manufacturing the master, the master having, on its outer peripheral surface, a concave-convex structure in which concavities or convexities are continuously arranged with high precision. The master includes: a substrate with a hollow cylindrical shape or cylindrical shape; and a concave-convex structure on an outer peripheral surface of the substrate. The concave-convex structure has concavities or convexities continuously arranged at a predetermined pitch in a circumferential direction of the substrate. The concavities or convexities are arranged with a predetermined phase difference between circumferential rows adjacent in an axial direction of the substrate.

5 Claims, 11 Drawing Sheets

(51) Int. Cl.
  *B29C 59/16* (2006.01)
  *G03F 7/00* (2006.01)
  *B29C 35/08* (2006.01)
  *B29C 59/04* (2006.01)
  *B29C 59/02* (2006.01)

(52) U.S. Cl.
  CPC ............ *B29C 59/046* (2013.01); *B29C 59/16* (2013.01); *G03F 7/00* (2013.01); *B29C 2035/0827* (2013.01); *B29C 2059/023* (2013.01)

(56) References Cited

FOREIGN PATENT DOCUMENTS

| | | |
|---|---|---|
| JP | 2010-156843 A | 7/2010 |
| JP | 2011-118049 A | 6/2011 |
| JP | 2012-128353 A | 7/2012 |
| JP | 2015-092576 A | 5/2015 |
| JP | 2015-136885 A | 7/2015 |
| JP | 2016-028867 A | 3/2016 |
| JP | 2016-033647 A | 3/2016 |
| JP | 2016-094015 A | 5/2016 |
| JP | 2016-105203 A | 6/2016 |
| TW | 201201946 A1 | 1/2012 |
| TW | 201529505 A | 8/2015 |

OTHER PUBLICATIONS

Mar. 8, 2021, Taiwanese Office Action issued for related TW Application No. 106131408.
Dec. 21, 2021, Japanese Office Action issued for related JP Application No. 2020-216699.
Aug. 26, 2022, Chinese Office Action issued for related CN Application No. 201780056662.2.
Sep. 23, 2022, Taiwanese Office Action issued for related TW Application No. 110142983.

* cited by examiner

MASTER, TRANSFER COPY, AND METHOD FOR MANUFACTURING MASTER

CROSS REFERENCE TO PRIOR APPLICATION

This application is a National Stage Patent Application of PCT International Patent Application No. PCT/JP2017/031991 (filed on Sep. 5, 2017) under 35 U.S.C. § 371, which claims priority to Japanese Patent Application No. 2016-181844 (filed on Sep. 16, 2016), which are all hereby incorporated by reference in their entirety.

TECHNICAL FIELD

The present invention relates to a master, a transfer copy, and a method for manufacturing the master.

BACKGROUND ART

Imprinting is one of micro-processing techniques that have been recently developed. In imprinting, a cylindrical master having a fine concave-convex structure on its surface is pressed against a resin sheet or the like so that the concave-convex structure on the surface of the master is transferred to the resin sheet.

The master used in imprinting is manufactured by using, for example, laser lithography. Specifically, the master is manufactured by continuously forming a pattern on the outer peripheral surface of a cylindrical substrate by irradiation of the substrate with a laser beam while the cylindrical substrate is rotated about its central axis and scanning is performed in the axial direction of the substrate.

Here, there is a need to further improve processing precision of imprinting like other micro-processing techniques. In particular, when a transfer copy having a concave-convex structure is used as an optical member such as an anti-reflection film, there is a need to increase the density of concavities or convexities and precisely control the arrangement of concavities or convexities in order to reduce diffraction and scattering and improve optical characteristics. There is also a need to precisely control the arrangement of a concave-convex structure on the transfer copy for surface plasmon filters and substrates for light-emitting devices.

There is therefore a need of a technique for more precisely controlling the arrangement of an exposure pattern on the outer peripheral surface of a cylindrical master used in imprinting.

For example, Patent Literature 1 described blow discloses a nanoimprint mold exposure method. In this method, the exposure start position is controlled on the basis of a start pulse of a rotation control signal when an exposure pattern is formed on a roll-shaped member. In the technique disclosed in Patent Literature 1, an exposure pattern with a desired arrangement is obtained by controlling the start position of the exposure pattern for each rotation of the roll-shaped member on the basis of a start pulse generated at regular timing for each rotation of the roll-shaped member.

CITATION LIST

Patent Literature

Patent Literature 1: JP 2011-118049 A

SUMMARY OF INVENTION

Technical Problem

However, the technique disclosed in Patent Literature 1 described above fails to provide the continuity of the exposure pattern since the start position of the exposure pattern is controlled for each rotation of the roll-shaped member. As a result, the exposure pattern on the roll-shaped member has a blank region with no exposure pattern at one position for each rotation. In the technique disclosed in Patent Literature 1, it is thus difficult to form a continuous exposure pattern without interruption on the outer peripheral surface of the roll-shaped member while controlling the arrangement of the exposure pattern.

Accordingly, the present invention has been devised in light of the above issue, and an object of the present invention is to provide a novel and improved master having, on its outer peripheral surface, a concave-convex structure in which the arrangement of concavities or convexities is precisely controlled, a transfer copy obtained by using the master, and a method for manufacturing the master.

Solution to Problem

To solve the problem described above, according to an aspect of the present invention, there is provided a master including: a substrate with a hollow cylindrical shape or cylindrical shape; and a concave-convex structure on an outer peripheral surface of the substrate. The concave-convex structure has concavities or convexities continuously arranged at a predetermined pitch in a circumferential direction of the substrate. The concavities or convexities are arranged with a predetermined phase difference between circumferential rows adjacent in an axial direction of the substrate.

It is preferable that the concave-convex structure do not have a blank region where the concavities or convexities are not formed in the axial direction of the substrate, or an error region where concavities or convexities are formed in an arrangement different from the arrangement of the concavities or convexities.

The concave-convex structure may have the concavities or convexities arranged in a hexagonal lattice.

An average pitch between the concavities or convexities may be less than 1 µm.

At least the outer peripheral surface of the substrate may include a glass material.

To solve the problem described above, according to another aspect of the present invention, there is provided a method for manufacturing a master, the method including: a step of sharing a reference clock between a plurality of signal generating circuits, and generating a rotation control signal and an exposure signal in the plurality of respective signal generating circuits; and a step of forming a pattern on an outer peripheral surface of a substrate with a hollow cylindrical shape or cylindrical shape by rotating the substrate about a central axis of the substrate on a basis of the rotation control signal and irradiating the outer peripheral surface of the substrate with a laser beam on a basis of the exposure signal while performing scanning in an axial direction of the substrate.

It is preferable that a frequency of the rotation control signal be not an integral multiple of a frequency of the exposure signal.

It is preferable that, in one rotation of the substrate, a number of pulses from the rotation control signal be an integer, and a number of pulses from the exposure signal be not an integer.

The rotation control signal may be in synchronization with the exposure signal.

The outer peripheral surface of the substrate may be provided with a resist layer to be patterned by irradiation with the laser beam. The method may further include a step of forming a concave-convex structure on the outer peripheral surface of the substrate by etching the substrate using, as a mask, the resist layer that has been patterned by irradiation with the laser beam.

The patterning by irradiation with the laser beam may be performed by thermal lithography.

To solve the problem described above, according to another aspect of the present invention, there is provided a master manufactured by the method according to any one of what have been described above.

To solve the problem described above, according to another aspect of the present invention, there is provided a transfer copy obtained by transferring a concave-convex structure on an outer peripheral surface of the master to a sheet-shaped substrate with the master.

Advantageous Effects of Invention

According to the present invention as described above, it is possible to provide a master having, on its outer peripheral surface, a concave-convex structure in which the arrangement of concavities or convexities is precisely controlled. It is also provide a transfer copy to which the inverted structure of the concave-convex structure on the outer peripheral surface of the master has been transferred.

DESCRIPTION OF EMBODIMENTS

Figure 1:
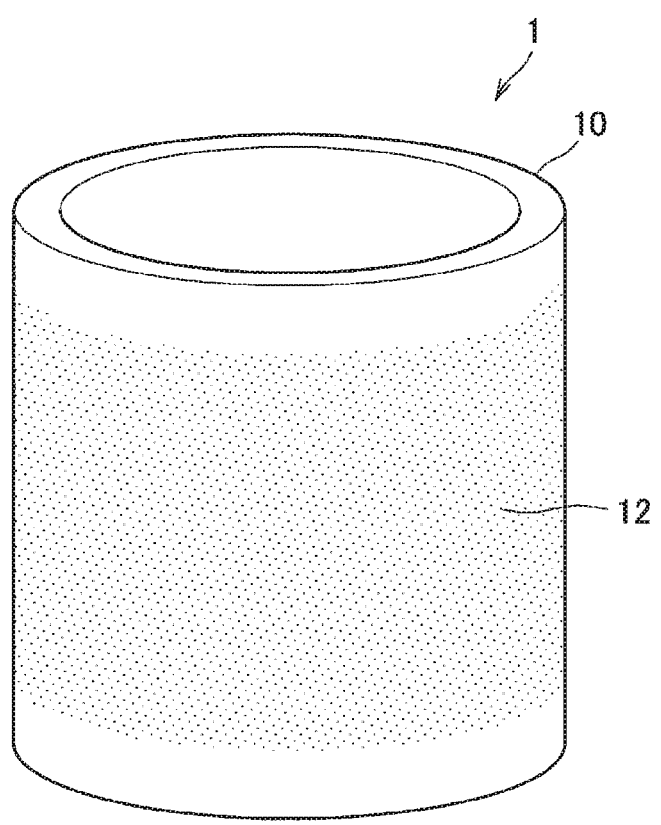
FIG. 1 is a schematic perspective view of a master according to an embodiment of the present invention.

Hereinafter, (a) preferred embodiment(s) of the present invention will be described in detail with reference to the appended drawings. Note that, in this specification and the appended drawings, structural elements that have substantially the same function and structure are denoted with the same reference numerals, and repeated explanation of these structural elements is omitted.

<1. Master>

First, referring to FIG. 1, an overview of a master according to an embodiment of the present invention will be described. FIG. 1 is a schematic perspective view of the master according to the present embodiment.

As illustrated in FIG. 1, a master 1 according to the present embodiment includes, for example, a substrate 10 having a concave-convex structure 12 on its outer peripheral surface.

The master 1 is, for example, a master used in roll-to-roll imprinting. In roll-to-roll imprinting, the outer peripheral surface of the master 1 is pressed against the sheet-shaped substrate or the like as the master 1 rotates, whereby the concave-convex structure on the outer peripheral surface can be transferred to a sheet-shaped substrate or the like. The use of such imprinting enables efficient production of a large-area transfer copy to which the concave-convex structure 12 on the outer peripheral surface of the master 1 has been transferred.

The transfer copy to which the concave-convex structure 12 has been transferred by using the master 1 may be used as, for example, an optical member such as a surface plasmon filter, a light-emitting device, or an anti-reflection film.

The substrate 10 is, for example, a member with a hollow cylindrical shape or cylindrical shape. The substrate 10 may have a hollow cylindrical shape with a hollow inside as illustrated in FIG. 1, or may have a solid cylindrical shape without a hollow inside. The substrate 10 may include a glass material such as fused quartz glass or synthetic quartz glass, or may include, for example, a metal such as stainless steel, or such a metal with the outer peripheral surface coated with $SiO_2$ or the like.

However, the substrate 10 preferably includes a glass material at least on the outer peripheral surface and more preferably entirely includes a glass material such as quartz glass. This is because, in the case where the substrate 10 includes a glass material mainly including $SiO_2$, the concave-convex structure 12 can be easily formed on the outer peripheral surface of the substrate 10 by etching using a fluorine compound. Specifically, the concave-convex structure 12 can be easily formed on the substrate 10 by forming a pattern corresponding to the concave-convex structure 12 in a resist layer on the outer peripheral surface of the substrate 10 by using laser lithography, and then performing dry etching using the resist layer as a mask.

The size of the substrate 10 is not limited. For example, the length of the substrate 10 in the axial direction may be 100 mm or more, and the outer diameter may be 50 mm or more and 300 mm or less. In the case where the substrate 10 has a hollow cylindrical shape, the thickness of the hollow cylinder may be 2 mm or more and 50 mm or less.

The concave-convex structure 12 is formed on the outer peripheral surface of the substrate 10 and has continuously arranged concavities or convexities. Specifically, in the concave-convex structure 12, the concavities or convexities are continuously arranged at a predetermined pitch in the circumferential direction of the substrate 10, and the concavities or convexities are arranged with a predetermined phase difference between circumferential rows adjacent in the axial direction of the substrate 10. In other words, the concavities or convexities in the concave-convex structure 12 are out of phase with each other in the axial direction of the substrate 10. The concavities or convexities are thus out of alignment with each other on a straight line parallel to the axial direction of the substrate 10, but aligned with each other on a straight line at an angle to the axial direction of the substrate 10.

The concavities or convexities 121 refer to either convexities that protrude in the direction perpendicular to the outer peripheral surface of the substrate 10 or concavities that are concaved in the direction perpendicular to the outer peripheral surface of the substrate 10 and do not refer to a mixture of convexities and concavities in one master 1.

Figure 2:
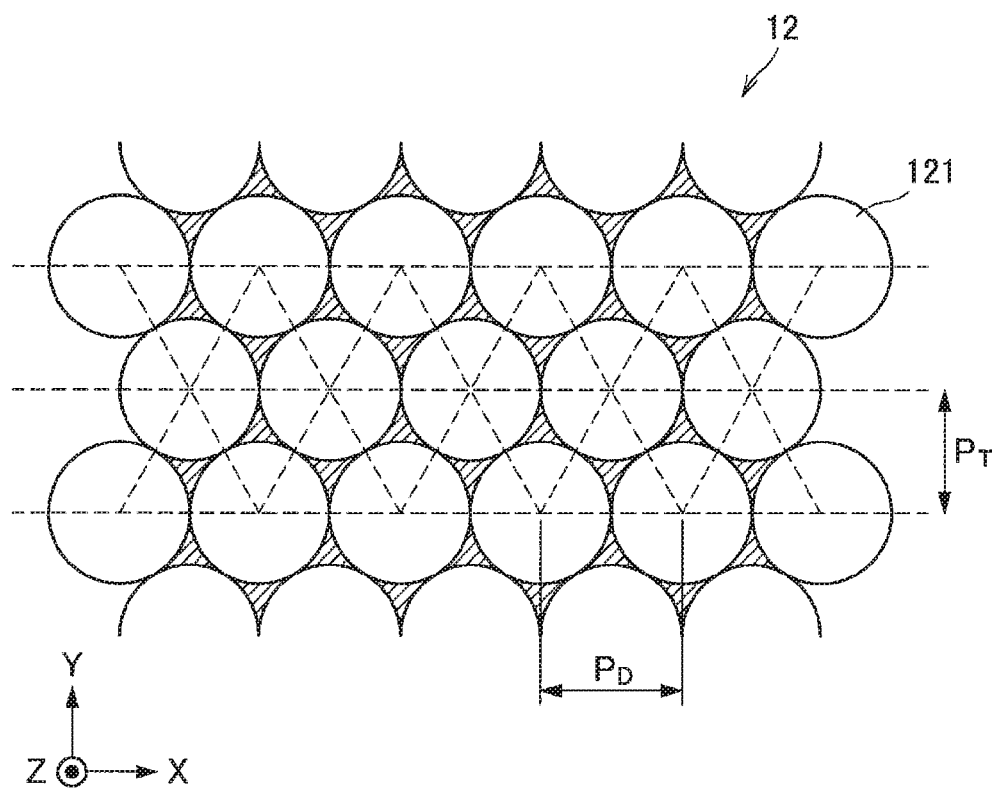
FIG. 2 is a plan view of an example of a concave-convex structure on an outer peripheral surface of the master according to the embodiment.

Referring to FIG. 2, a specific structure of the concave-convex structure 12 on the outer peripheral surface of the master according to the present embodiment will be described here. FIG. 2 is a plan view of an example of the concave-convex structure 12 on the outer peripheral surface of the master according to the present embodiment. In FIG. 2, the direction X corresponds to the circumferential direction of the substrate 10, the direction Y corresponds to the axial direction of the substrate 10, and the direction Z corresponds to the direction perpendicular to the outer peripheral surface of the substrate 10.

As illustrated in FIG. 2, the concave-convex structure 12 may be a concave-convex structure with the concavities or convexities 121 arranged in hexagonal lattice. In this case, the pitch between the concavities or convexities 121 in the circumferential direction of the substrate 10 is also referred to as a dot pitch $P_D$, and the interval between the concavities or convexities 121 in circumferential rows (also called tracks) adjacent in the axial direction of the substrate 10 is also referred to as a track pitch $P_T$.

In the concave-convex structure 12, the center positions of the concavities or convexities 121 adjacent in the axial direction of the substrate 10 shift by ½$P_D$ for each array (that is, track) of the concavities or convexities 121 in the circumferential direction of the substrate 10. In other words, in the concave-convex structure 12, the phases of the concavities or convexities 121 shift by 180° between adjacent circumferential rows.

The dot pitch $P_D$ and the track pitch $P_T$ in the concave-convex structure 12 may be, for example, less than 1 μm, preferably wavelengths or less in the visible light region, and more preferably 100 nm or more and 350 nm or less. In the case where the concave-convex structure 12 is a fine structure having such pitches, the concave-convex structure 12 can function as what is called a moth eye structure, which reduces reflection of incident light in a wide wavelength range.

However, if either the dot pitch $P_D$ or the track pitch $P_T$ is less than 100 nm, it is difficult to form the concave-convex structure 12, which is not preferred. If either the dot pitch $P_D$ or the track pitch $P_T$ is more than 350 nm, diffraction of visible light occurs, and the function as a moth eye structure is deteriorated, which is not preferred. As long as the dot pitch $P_D$ and the track pitch $P_T$ are in the foregoing range, the dot pitch $P_D$ and the track pitch $P_T$ may be the same or different.

The concave-convex structure 12 is not limited to hexagonal lattice arrangement, and may have other arrangement. For example, the concave-convex structure 12 may have the concavities or convexities 121 arranged at the apexes and centers of squares. However, to most densely arrange the concavities or convexities 121 on a plane, the concave-convex structure 12 preferably has hexagonal lattice arrangement in which the concavities or convexities 121 are arranged at the apexes and centers of hexagons.

The concave-convex structure 12 has the concavities or convexities that are continuously arranged without interruption. The concave-convex structure 12 does not include a blank region where the concavities or convexities are not formed in the axial direction of the substrate 10, or an error region where the arrangement of concavities or convexities is disordered. Specifically, the inside of the region with the concave-convex structure 12 does not have a blank region where the concavities or convexities are not formed in order to adjust the start position of the exposure pattern, or an error region where the arrangement of the concavities or convexities is disordered due to the formation of a different pattern during exposure.

The transfer copy manufactured by using the master 1 having the concave-convex structure 12 like this eliminates the need to select regions with the concave-convex structure 12 before use, and also eliminates the need to discard regions other than the regions with the concave-convex structure 12. Therefore, the master 1 according to the present embodiment enables more efficient mass production of the transfer copy to which the concave-convex structure 12 has been transferred.

<2. Method for Manufacturing Master>

(2.1. Overview)

Next, a method for manufacturing the master 1 according to the present embodiment will be described.

The master 1 according to the present embodiment is manufactured by forming a pattern corresponding to the concave-convex structure 12 on the outer peripheral surface of the substrate 10 by using laser thermal lithography, and then forming the concave-convex structure 12 on the substrate 10 by etching or the like. The arrangement of concavities or convexities in the concave-convex structure 12 in the master 1 according to the present embodiment can be precisely controlled by forming the pattern corresponding to the concave-convex structure 12 by using lithography with a laser beam whose irradiation position can be controlled with high precision.

Here, anodizing is known as one of methods for forming a concave-convex structure such as what is called a moth eye structure. Anodizing involves passing a current through an electrolyte solution, with an aluminum substrate serving as an anode, which can simultaneously cause dissolution and oxidation of the aluminum substrate and thus form a self-organized arrangement of cylindrical pores on the surface of the aluminum substrate.

However, in anodizing, the planar arrangement of concavities or convexities depends on self-organization, which makes it difficult to form a given arrangement of concavities or convexities. In anodizing, the arrangement precision of the concavities or convexities is also affected by the surface condition of the aluminum substrate and the uniformity of crystal grains, which makes it difficult to achieve arrangement precision similar to that of the concave-convex structure 12 of the master 1 according to the present embodiment. Furthermore, in anodizing, the concave-convex structure can be formed only on a metal such as aluminum that easily undergoes dissolution and oxidation in the presence of an electric current in an electrolyte solution. In other words, not the use of anodizing, but the use of laser lithography alone enables the master 1 according to the present embodiment to be manufactured.

Specifically, the method for manufacturing the master 1 according to the present embodiment includes a depositing step of depositing a resist layer on the outer peripheral surface of the substrate 10, an exposing step of irradiating the resist layer with a laser beam to form a latent image, a developing step of developing the resist layer with the latent image to pattern the resist layer, and an etching step of performing etching with the patterned resist layer serving as a mask to form the concave-convex structure 12 on the outer peripheral surface of the substrate 10.

In the depositing step, the resist layer is deposited on the outer peripheral surface of the substrate 10. The resist layer contains an inorganic material or organic material in which a latent image can be formed with a laser beam. As the inorganic material, a metal oxide containing, for example, one or two or more transition metals such as tungsten or molybdenum can be used. The resist layer containing an inorganic material can be deposited by using, for example, sputtering. Meanwhile, as the organic material, for example, a novolak resist, a chemically amplified resist or the like can be used. The resist layer containing an organic material can be deposited by using spin coating or the like.

In the exposing step, the resist layer on the outer peripheral surface of the substrate 10 is irradiated with a laser beam to form, in the resist layer, a latent image with a pattern corresponding to the concave-convex structure 12. The wavelength of the laser beam with which the resist layer is irradiated is not limited, but may be a wavelength in the blue light region from 400 nm to 500 nm.

In the developing step, the resist layer in which the latent image has been formed by irradiation with the laser beam is developed to form the pattern corresponding to the latent image in the resist layer. For example, in the case where the resist layer contains the inorganic material described above, the resist layer can be developed by using an alkaline solution such as an aqueous solution of tetramethylammonium hydroxide (TMAH). In the case where the resist layer contains the organic material described above, the resist layer can be developed by using an organic solvent such as an ester or an alcohol.

In the etching step, the substrate 10 is etched by using the patterned resist layer as a mask to form the concave-convex structure 12 corresponding to the latent image on the outer peripheral surface of the substrate 10. The substrate 10 may be etched by either dry etching or wet etching. In the case where the substrate 10 includes a glass material (e.g., quartz glass) mainly including $SiO_2$, the substrate 10 can be etched by dry etching with a fluorocarbon gas or wet etching with hydrofluoric acid or the like.

(2.2. Exposure Method)

Figure 3:
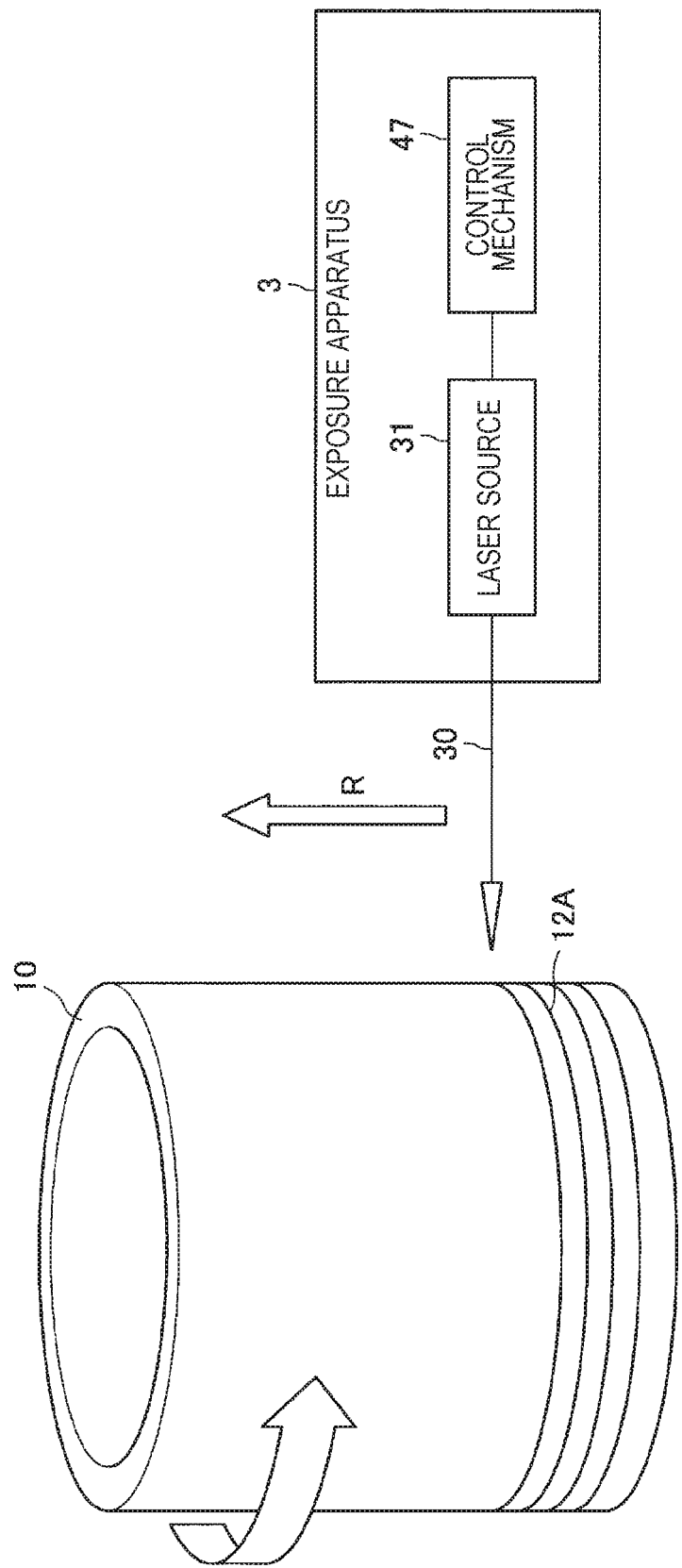
FIG. 3 is a schematic view illustrating an exposure method used in a method for manufacturing a master according to an embodiment of the present invention.

Next, referring to FIG. 3 to FIG. 7, an exposure method used in the method for manufacturing the master 1 according to the present embodiment will be described. FIG. 3 is a schematic view illustrating the exposure method used in the method for manufacturing the master 1 according to the present embodiment.

In the exposing step in the method for manufacturing the master 1 according to the present embodiment, the exposure signal that controls emission of the laser beam and the rotation control signal that controls rotation of the substrate 10 share a reference clock. This enables precise control of the irradiation position of the laser beam on the outer peripheral surface of the substrate 10 and can thus improve the arrangement precision of the concave-convex structure 12 formed on the outer peripheral surface of the master 1.

As illustrated in FIG. 3, the method for manufacturing the master 1 according to the present embodiment involves, for example, forming an exposure pattern 12A on the outer peripheral surface of the substrate 10 by irradiating the substrate 10 with a laser beam 30 using an exposure apparatus 3 including a laser source 31, which emits the laser beam 30, and a control mechanism 47, which controls emission of the laser beam 30.

The laser source 31 emits the laser beam 30. The laser source 31 may be, for example, a semiconductor laser source. The wavelength of the laser beam 30 emitted by the laser source 31 is not limited, but may be, for example, a wavelength in the blue light region from 400 nm to 500 nm.

The control mechanism 47 generates the exposure signal that controls emission of the laser beam 30. The control mechanism 47 may be, for example, a function generator including a signal generating circuit that can generate a signal with a given waveform.

In the exposure apparatus 3, the exposure pattern 12A is formed on the outer peripheral surface of the substrate 10, which has a hollow cylindrical shape or cylindrical shape and rotates about its central axis, upon irradiation of the outer peripheral surface of the substrate 10 with the laser beam 30 while performing scanning along the axial direction (the direction indicated by arrow R in FIG. 3) of the substrate 10. Accordingly, the exposure apparatus 3 enables spiral irradiation of the outer peripheral surface of the substrate 10 with the laser beam and can thus form the exposure pattern 12A in desired regions on the outer peripheral surface of the substrate 10.

Since the circumference of the substrate 10 may change for each rotation due to the machining error of the substrate 10, failed synchronization between the exposure signal and the rotation control signal disorders the arrangement of the exposure pattern as the exposure progresses. In addition, since the rotation speed of the spindle motor of a turn table for rotating the substrate 10 fluctuates, the fluctuation in rotation speed disorders the arrangement of the exposure pattern.

Therefore, the synchronization between the exposure signal and the rotation control signal has conventionally prevented or reduced arrangement disorder of the exposure pattern for each rotation. In this case, however, the frequency of the exposure signal is limited to the divided or multiplied frequency of the rotation control signal. It is thus difficult to synchronize the exposure signal and the rotation control signal in forming an exposure pattern with an arrangement in which the pitch is shifted for each rotation, such as hexagonal lattice arrangement.

It has thus been studied that the exposure pattern of hexagonal lattice arrangement is formed by, for example, inverting the phase of the exposure signal for each rotation or adjusting the exposure start timing for each rotation by using a start pulse (also called Z phase signal) generated, at regular timing for each rotation, from the spindle motor of the turn table for rotating the substrate 10. However, in this case, a blank region where no exposure pattern is formed or an error region where the exposure pattern deviates from a desired pattern is generated for each rotation, which impairs the continuity of the exposure pattern.

In the method for manufacturing the master 1 according to the present embodiment, the exposure signal and the rotation control signal share a reference clock serving as a reference for signal generation, so that the exposure signal and the rotation control signal are in synchronization with each other. According to this feature, the frequency of the exposure signal is not limited to the divided or multiplied frequency of the rotation control signal and can be set to a given value. According to the method for manufacturing the master 1 according to the present embodiment, a continuous exposure pattern with given arrangement can thus be formed on the outer peripheral surface of the substrate 10 while the continuity of the exposure signal is maintained. According to the method for manufacturing the master 1 according to the present embodiment, the continuous concave-convex structure 12 in which the concavities or convexities are arranged with high precision without interruption, pattern disorder, or the like can thus be formed on the outer peripheral surface of the master 1.

Figure 4:
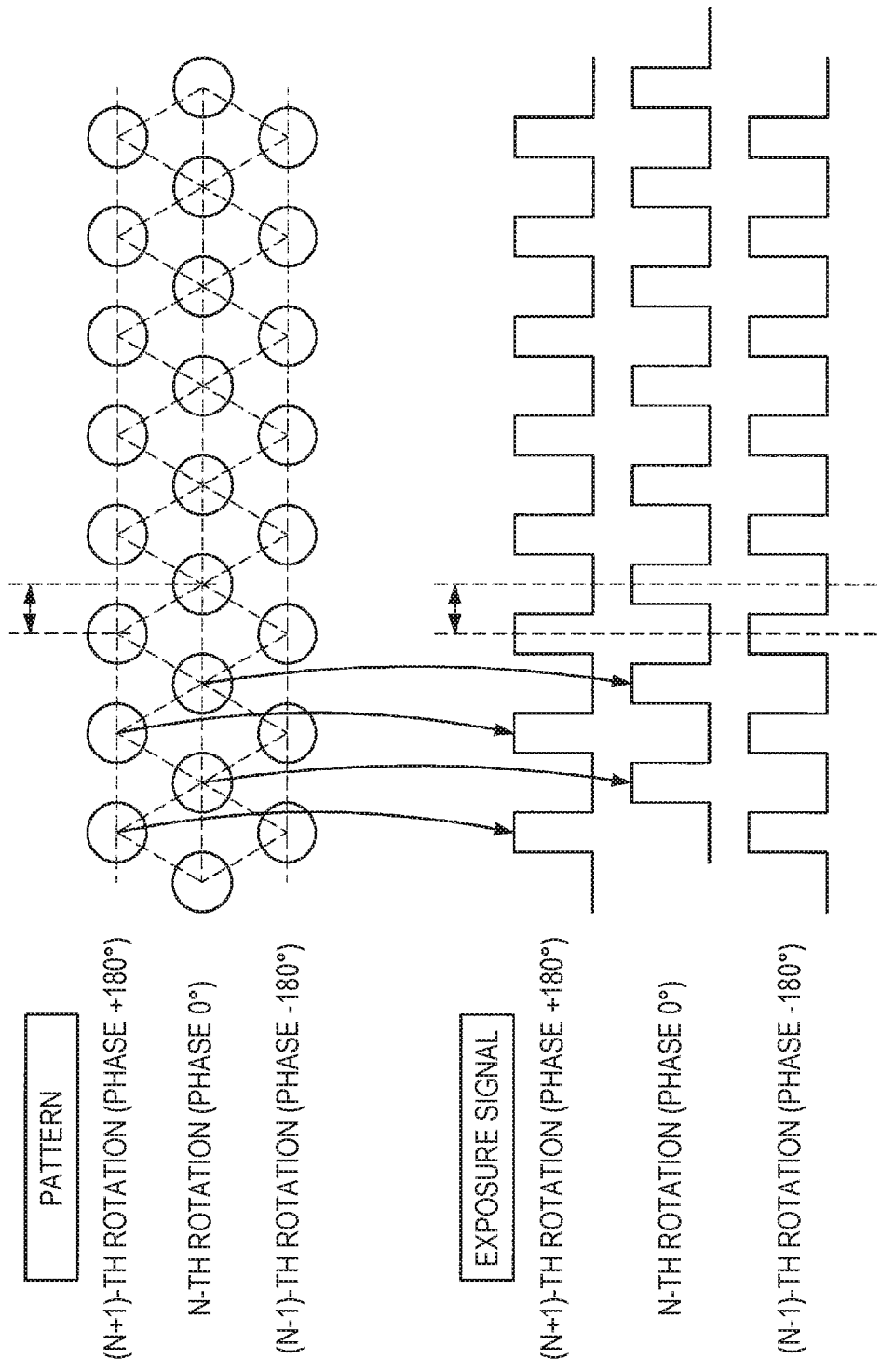
FIG. 4 is an explanatory view illustrating a correspondence relationship between an exposure signal and an exposure pattern in the embodiment.

Referring to FIG. 4, the correspondence relationship between the exposure signal generated by the control mechanism 47 and the exposure pattern 12A formed on the outer peripheral surface of the substrate 10 will be specifically described here. FIG. 4 is an explanatory view illustrating the correspondence relationship between the exposure signal and the exposure pattern.

As illustrated in FIG. 4, in the case where the exposure pattern with circular dots arranged in hexagonal lattice is formed on the outer peripheral surface of the substrate 10, the exposure apparatus 3 may use, as the exposure signal, for example, a pulse wave whose amplitude repeatedly alternately reaches high level and low level at predetermined periods. At this time, the exposure apparatus 3 may control emission of the laser beam 30 so as to form an exposure pattern on the outer peripheral surface of the substrate 10 when the amplitude of the exposure signal reaches high level.

To arrange circular dots in hexagonal lattice in the exposure pattern, it is important to precisely control the arrangement of the exposure pattern formed on the outer peripheral surface of the substrate 10. For example, the circular dots can be arranged in hexagonal lattice by setting the frequency of the rotation control signal and the exposure signal, which controls irradiation with the laser beam 30, such that the exposure signal shifts by ½ pulses between circumferential rows adjacent in the axial direction of the substrate 10.

Figure 5:
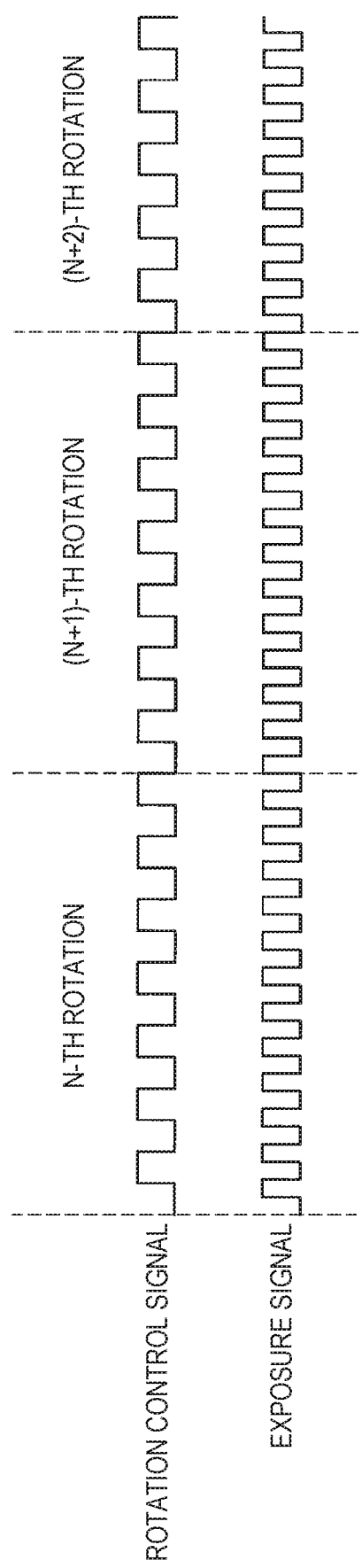
FIG. 5 is an explanatory view illustrating a correspondence relationship between the exposure signal and a rotation control signal in the embodiment.

Referring to FIG. 5, the correspondence relationship between the rotation control signal and the exposure signal in the case of forming the hexagonal lattice exposure pattern as illustrated in FIG. 4 will be specifically described. FIG. 5 is an explanatory view illustrating the correspondence relationship between the exposure signal and the rotation control signal.

In order to invert the phase of the exposure signal by 180° for each rotation while the signal continuity of the exposure signal and the rotation control signal is maintained, it is important that the exposure signal generates a number of pulses including a fractional part of 0.5, not an integer number of pulses, while the rotation control signal generates an integer number of pulses corresponding to one rotation. The spindle motor of the turn table is controlled so as to make one rotation when the rotation control signal inputs a predetermined number of pulses. When the number of pulses of the exposure signal includes a fractional part of 0.5, the phase in the n-th rotation and the (n+2)-th rotation can thus be shifted by 180° with respect to the phase in the (n+1)-th rotation.

Accordingly, the number of pulses of the exposure signal is controlled to include a fractional part of 0.5, while the number of pulses of the rotation control signal corresponding to one rotation is controlled to be an integer. As a result, the phase of the exposure signal can be inverted by 180° for each rotation. It is thus possible to form a hexagonal lattice exposure pattern in which circular dots are staggered in circumferential rows adjacent in the axial direction of the substrate 10.

(2.3. Signal Generation Method)

Figure 6:
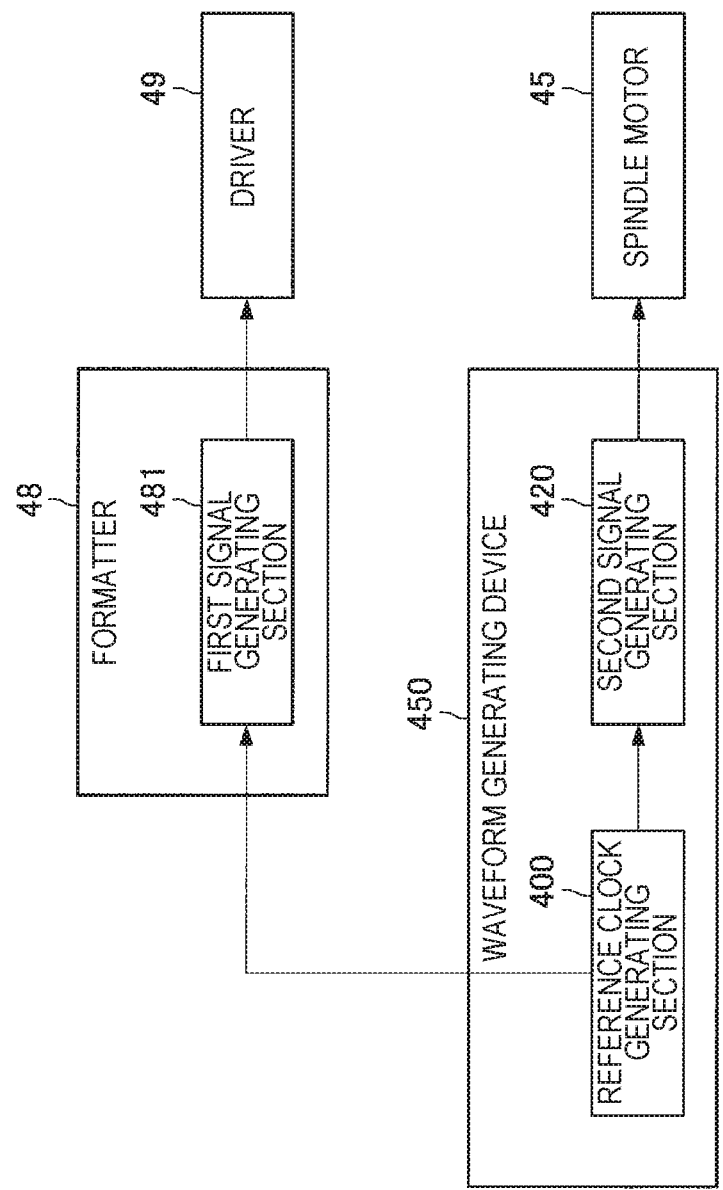
FIG. 6 is a block diagram illustrating a mechanism for generating the exposure signal and the rotation control signal in the embodiment.

Next, referring to FIG. 6, a method for generating the exposure signal and the rotation control signal described above will be described. FIG. 6 is a block diagram illustrating the mechanism for generating the exposure signal and the rotation control signal.

As illustrated in FIG. 6, a waveform generating device 450, which generates a rotation control signal, has a reference clock generating section 400 built therein. The reference clock generated by the reference clock generating section 400 is supplied to a formatter 48, which generates an exposure signal. The exposure signal generated by the formatter 48 is inputted into a driver 49 and used to control emission of the laser beam 30 from the laser source 31. The rotation control signal generated by the waveform generating device 450 is inputted into a spindle motor 45 and used to control rotation of the spindle motor 45 of a turn table for rotating the substrate 10.

The reference clock generating section 400 generates a pulse wave with a predetermined frequency, which serves as a reference clock. The generated reference clock is supplied to a first signal generating section 410 in the formatter 48 and a second signal generating section 420 in the waveform generating device 450.

The first signal generating section 410 is included in the formatter 48 and performs signal processing on the supplied reference clock to generate an exposure signal. Specifically, the first signal generating section 410 generates an exposure signal by changing the frequency of the reference clock so as to form a desired exposure pattern and controlling the duty cycle of the pulse wave in consideration of the output of the laser source 31 and the properties of the resist layer.

The second signal generating section 420 is included in the waveform generating device 450 and performs signal processing on the supplied reference clock to generate a rotation control signal. Specifically, the second signal generating section 420 generates a rotation control signal by changing the frequency of the reference clock such that the spindle motor 45 of the turn table rotates at a desired rotation speed.

Here, in the case of exposing the hexagonal lattice array pattern, the frequency of the exposure signal generated by the first signal generating section 410 is not an integral multiple of the frequency of the rotation control signal generated by the second signal generating section 420. This is because the frequency is set such that the exposure signal generates a number of pulses including a fractional part of 0.5 while the rotation control signal generates an integer number of pulses. Thus, the exposure signal and the rotation control signal cannot be generated in the same signal generating circuit, but are generated in separate signal generating circuits as illustrated in FIG. 6. Since the frequency of the exposure signal is not an integral multiple of the frequency of the rotation control signal but the exposure signal and the rotation control signal are generated in signal generating circuits that share a reference clock, the exposure signal and the rotation control signal are in synchronization with each other.

Although FIG. 6 illustrates a configuration where the reference clock generating section 400 is located in the waveform generating device 450, the present invention is not limited to this configuration. For example, the spindle motor 45 of the turn table also has a signal generating circuit built therein, and thus an output signal in synchronization with the rotation control signal can be extracted from the spindle motor 45. This output signal may thus be used to generate an exposure signal. Even in such a case, the exposure signal in synchronization with the rotation control signal can be obtained.

(2.4. Configuration of Exposure Apparatus)

Figure 7:
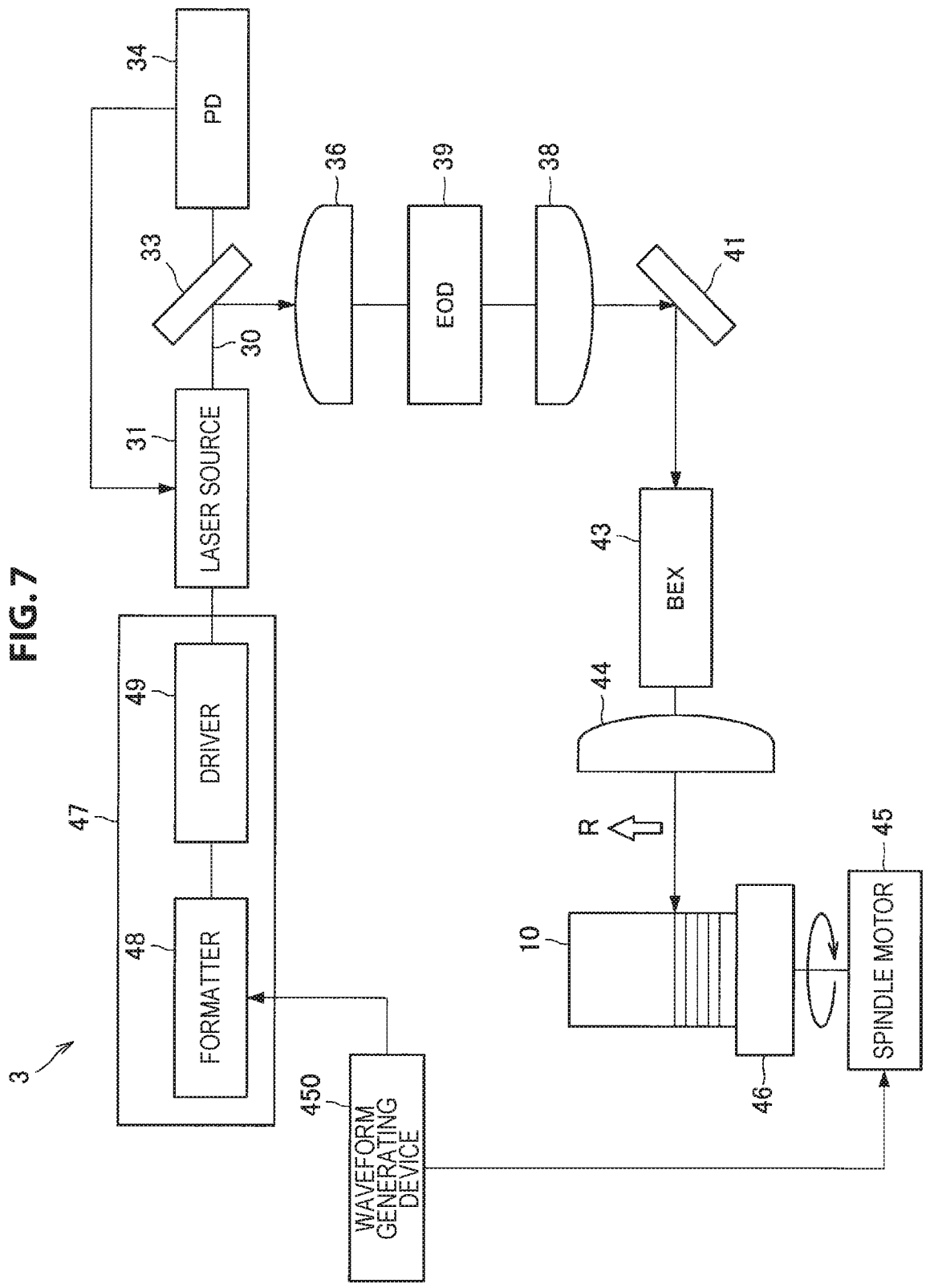
FIG. 7 is a block diagram describing a specific configuration of an exposure apparatus used in exposure of a substrate in the embodiment.

Next, referring to FIG. 7, a specific configuration of the exposure apparatus 3 which performs exposure of the substrate 10 with a hollow cylindrical shape or cylindrical shape by using the exposure signal and the rotation control signal generated by the configuration illustrated in FIG. 6 will be described. FIG. 7 is a block diagram describing a specific configuration of the exposure apparatus 3 used in exposure of the substrate 10.

As illustrated in FIG. 7, the exposure apparatus 3 includes the laser source 31, a first mirror 33, a photodiode (PD) 34, a condenser lens 36, an electro-optic deflector (EOD) 39, a collimator lens 38, a second mirror 41, a beam expander (BEX) 43, and an objective lens 44.

The laser source 31 is controlled by the exposure signal generated by the control mechanism 47. The laser beam 30 emitted from the laser source 31 is applied to the substrate 10 placed on a turn table 46. The turn table 46 on which the substrate 10 is placed rotates with the spindle motor 45 controlled by the rotation control signal generated by the waveform generating device 450. Here, since the common reference clock is supplied to the formatter 48 and the waveform generating device 450, the exposure signal and the rotation control signal are in synchronization with each other.

The laser source 31 emits the laser beam 30 to which the resist layer deposited on the outer peripheral surface of the substrate 10 is to be exposed, as described above. The laser source 31 may be, for example, a semiconductor laser source that emits a laser beam with a wavelength in the blue light region from 400 nm to 500 nm. The laser beam 30 emitted from the laser source 31 travels straight as it is a collimated beam. The laser beam 30 is reflected by the first mirror 33.

The laser beam 30 reflected by the first mirror 33 is condensed onto the electro-optic deflector 39 through the condenser lens 36 and then converted into a collimated beam through the collimator lens 38 again. The collimated laser beam 30 is reflected by the second mirror 41 and horizontally directed to a beam expander 43.

The first mirror 33 includes a polarization beam splitter and has a function of reflecting one of polarization components and transmitting the other polarization component. The polarization component that has passed through the first mirror 33 is photoelectrically converted by the photodiode 34, and the photoelectrically converted received light signal is inputted into the laser source 31. As a result, for example, the output of the laser beam 30 from the laser source 31 can be adjusted on the basis of the feedback from the inputted received light signal.

The electro-optic deflector 39 can control the irradiation position of the laser beam 30 with approximately nanometer-scale precision. In the exposure apparatus 3, the irradiation position of the laser beam 30 applied to the substrate 10 can be finely adjusted with the electro-optic deflector 39.

The beam expander 43 forms the laser beam 30 directed by the second mirror 41 into a desired beam shape. The laser beam 30 is applied to the resist layer deposited on the outer peripheral surface of the substrate 10 through the objective lens 44.

The turn table 46 supports the substrate 10. The turn table 46 rotates the substrate 10 as the turn table 46 is rotated by the spindle motor 45. Since the turn table 46 can cause the irradiation position of the laser beam 30 to move in the axial direction of the substrate 10 (that is, the direction indicated by arrow R) while rotating the substrate 10, the outer peripheral surface of the substrate 10 can be spirally exposed. The irradiation position of the laser beam 30 may be moved by moving, along a slider, either a laser head including the laser source 31 or the turn table 46 that supports the substrate 10.

The control mechanism 47 includes the formatter 48 and the driver 49 and controls emission of the laser beam 30 from the laser source 31 to control the irradiation time and the irradiation position of the laser beam 30.

The driver 49 controls emission of the laser beam 30 from the laser source 31 on the basis of the exposure signal generated by the formatter 48. Specifically, the driver 49 may control the laser source 31 such that the outer peripheral surface of the substrate 10 is irradiated with the laser beam 30 when the amplitude of the exposure signal reaches high level. The spindle motor 45 rotates the turn table 46 on the basis of the rotation control signal generated by the waveform generating device 450. Specifically, the spindle motor 45 may control rotation such that the turn table 46 makes one rotation when the rotation control signal inputs a predetermined number of pulses.

The exposure apparatus 3 as described above enables formation of an exposure pattern on the substrate 10. The exposure apparatus 3 enables precise formation of the exposure pattern with given arrangement on the outer peripheral surface of the substrate 10.

The substrate 10 exposed by the exposure apparatus 3 undergoes the developing step and the etching step as described above, which forms the concave-convex structure 12 on the outer peripheral surface of the substrate 10. The master 1 according to the present embodiment is manufactured accordingly.

<3. Usage Example of Master>

Figure 8:
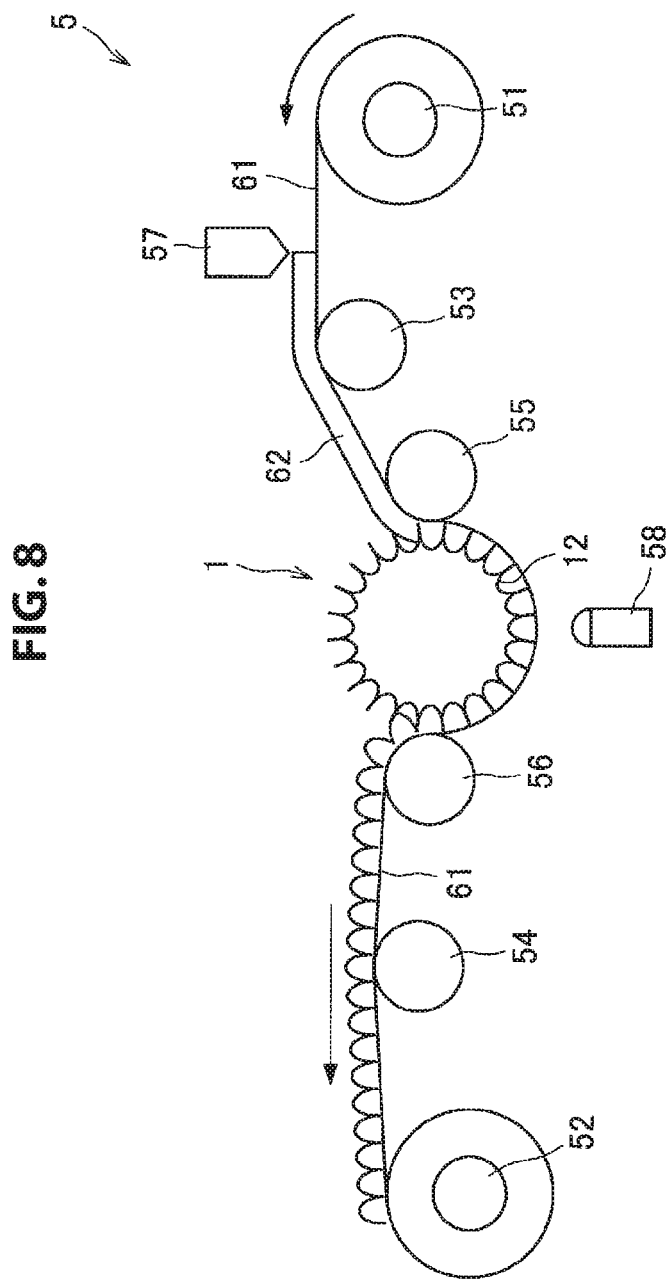
FIG. 8 is a schematic view illustrating a configuration of a transfer apparatus for manufacturing a transfer copy by using a master according to an embodiment of the present invention.

Next, referring to FIG. 8, a method for efficiently manufacturing a transfer copy by using the master 1 according to the present embodiment will be described. Specifically, a transfer copy to which the concave-convex structure 12 on the outer peripheral surface of the master 1 has been transferred can be continuously manufactured by using a transfer apparatus 5 illustrated in FIG. 8. FIG. 8 is a schematic view illustrating the configuration of the transfer apparatus 5 for manufacturing a transfer copy by using the master 1 according to the present embodiment.

As illustrated in FIG. 8, the transfer apparatus 5 includes the master 1, a substrate supply roll 51, a winding roll 52, guide rolls 53 and 54, a nip roll 55, a release roll 56, a coating device 57, and a light source 58. In other words, the transfer apparatus 5 illustrated in FIG. 8 is a roll-to-roll imprint transfer apparatus.

The substrate supply roll 51 is, for example, a roll around which a sheet-shaped substrate 61 is wound in a rolled manner. The winding roll 52 is a roll around which a transfer copy is wound. The transfer copy has a resin layer 62 laminated thereon, and the concave-convex structure 12 has been transferred to the resin layer 62. The guide rolls 53 and 54 convey the sheet-shaped substrate 61 before and after transfer. The nip roll 55 presses the sheet-shaped substrate 61 having the resin layer 62 laminated thereon against the master 1. The release roll 56 releases the sheet-shaped substrate 61 on which the resin layer 62 is laminated from the master 1 after the concave-convex structure 12 is transferred to the resin layer 62.

The coating device 57 includes a coating means such as a coater, and applies a photocurable resin composition to the sheet-shaped substrate 61 to form the resin layer 62. The coating device 57 may be, for example, a gravure coater, a wire bar coater, or a die coater. The light source 58 emits light having a wavelength with which a photocurable resin composition can be cured. The light source 58 may be, for example, an ultraviolet lamp.

The photocurable resin composition is cured when irradiated with light having a predetermined wavelength. Specifically, the photocurable resin composition may be an ultraviolet curable resin such as acrylic resin acrylate and epoxy acrylate. If necessary, the photocurable resin composition may contain an initiator, a filler, a functional additive, a solvent, an inorganic material, a pigment, an antistatic agent, or a sensitizing dye.

The resin layer 62 may include a thermosetting resin composition. In such a case, the transfer apparatus 5 includes a heater instead of the light source 58. The heater heats the resin layer 62, and the resin layer 62 is hereby cured, whereby the concave-convex structure 12 is transferred. The thermosetting resin composition may be, for example, a phenolic resin, an epoxy resin, a melamine resin, or a urea resin.

In the transfer apparatus 5, the sheet-shaped substrate 61 is first continuously fed from the substrate supply roll 51 through the guide roll 53. The photocurable resin composition is applied to the fed sheet-shaped substrate 61 by the coating device 57, so that the resin layer 62 is laminated on the sheet-shaped substrate 61. The sheet-shaped substrate 61 having the resin layer 62 laminated thereon is pressed against the master 1 by the nip roll 55. The concave-convex structure 12 formed on the outer peripheral surface of the master 1 is transferred to the resin layer 62 accordingly. The resin layer 62 to which the concave-convex structure 12 has been transferred is cured by irradiation with light from the light source 58. The inverted structure of the concave-convex structure 12 is formed in the resin layer 62 accordingly. The sheet-shaped substrate 61 to which the concave-convex structure 12 has been transferred is released from the master 1 by the release roll 56, fed to the winding roll 52 through the guide roll 54, and wound around the winding roll 52.

The transfer apparatus 5 like this can efficiently and continuously manufacture the transfer copy to which the concave-convex structure 12 on the outer peripheral surface of the master 1 has been transferred.

EXAMPLES

The master according to the present embodiment will be more specifically described below with reference to Example and Comparative Examples. Example described below is an example of the conditions for illustrating the operability and the effects of the master and the method for manufacturing the master according to the present embodiment. The master and the method for manufacturing the master according to the present invention are not limited to the following Example.

Example 1

A master according to Example 1 was manufactured through the following steps. First, a resist layer of about 50 nm to 60 nm including a material containing a tungsten oxide was sputtered on the outer peripheral surface of a hollow cylindrical substrate (axial length 480 mm×outer diameter 140 mm) including quartz glass. Next, a latent image was formed in the resist layer by performing laser thermal lithography using the exposure apparatus as illustrated in FIG. 7. A 10 MHz pulse signal with 50% duty cycle was used as a reference clock, and an exposure signal and a rotation control signal were each generated on the basis of the reference clock.

For example, the number of pulses corresponding to one rotation of a spindle motor (corresponding to the number of counts for one rotation of a rotary encoder that controls the spindle motor) is 4096 pulses. When the substrate 10 is rotated at 900 rpm, the frequency of the rotation control signal is 61.44 kHz (4096×900/60=61440).

The circumference of the hollow cylindrical substrate having an outer diameter of 140 mm is about 440 mm. Therefore, for example, in the case of forming a hexagonal lattice exposure pattern with circular dots arranged at a pitch of about 270 nm, the number of the dots along the circumference is 1628973.5. Therefore, the frequency of the exposure signal is 24.4346025 MHz (1628973.5×900/60=24434602.5) when the substrate 10 is rotated at 900 rpm.

Further, to form a hexagonal lattice with circular dots at a dot pitch of 270 nm, the interval (track pitch) between circumferential rows adjacent in the axial direction of the substrate is about 234 nm. To make spiral exposure at an interval of about 234 nm, the turn table and the irradiation position of a laser beam are thus moved at a relative speed of 3.51 μm/sec (234×900/60=3510).

The outer peripheral surface of the substrate was irradiated with and exposed to the laser beam while the irradiation position of the laser beam was moved at 3.51 μm/sec in the axial direction of the substrate by using the exposure signal with a frequency of 24.4346025 MHz and the rotation control signal with a frequency of 61.44 kHz (50% duty cycle for both signals).

Next, the substrate after exposure was subjected to development processing with NMD3 (2.38 mass % aqueous solution of tetramethylammonium hydroxide) (available from Tokyo Ohka Kogyo Co., Ltd.), whereby the resist in the latent image parts was dissolved to form a dot array concave-convex structure in the resist layer. Next, the substrate was etched for 60 to 120 minutes by performing reactive ion etching (RIE) with a $CHF_3$ gas (30 sccm) at a gas pressure of 0.5 Pa and an input power of 200 W using, as a mask, the resist layer obtained after development. The remaining resist layer was then removed.

The master having the concave-convex structure on its outer peripheral surface was manufactured through the above-described steps. A transfer copy was further manufactured by using the manufactured master. Specifically, a transfer copy according to Example 1 was manufactured by transferring the concave-convex structure on the outer peripheral surface of the master to an ultraviolet curable resin by using the transfer apparatus illustrated in FIG. 8. As the sheet-shaped substrate of the transfer copy, a polyethylene terephthalate film was used. The ultraviolet curable resin was cured by irradiation with ultraviolet rays from a metal halide lamp at 1000 mJ/cm$^2$ for 1 minute.

Comparative Example 1

A master and a transfer copy were manufactured by a method similar to that of Example 1 except that the exposure signal and the rotation control signal did not share a reference clock, and the exposure signal (24.576 MHz) in synchronization with the rotation control signal was generated by multiplying the frequency (61.44 kHz) of the rotation control signal by 400. In Comparative Example 1, the phase of the exposure signal was inverted by 180° for each rotation on the basis of a start pulse generated one time at regular timing per rotation in order to form a hexagonal lattice exposure pattern.

Comparative Example 2

A master and a transfer copy were manufactured by a method similar to that of Example 1 except that the exposure signal and the rotation control signal did not share a reference clock, and the exposure signal (24.576 MHz) in synchronization with the rotation control signal was generated by multiplying the frequency (61.44 kHz) of the rotation control signal by 400. In Comparative Example 2, the output timing of the exposure signal was controlled by measuring the number of pulses from a start pulse, which was generated one time at regular timing per rotation, for each rotation on the basis of the start pulse in order to form a hexagonal lattice exposure pattern.

(Evaluation Results)

Figure 9:
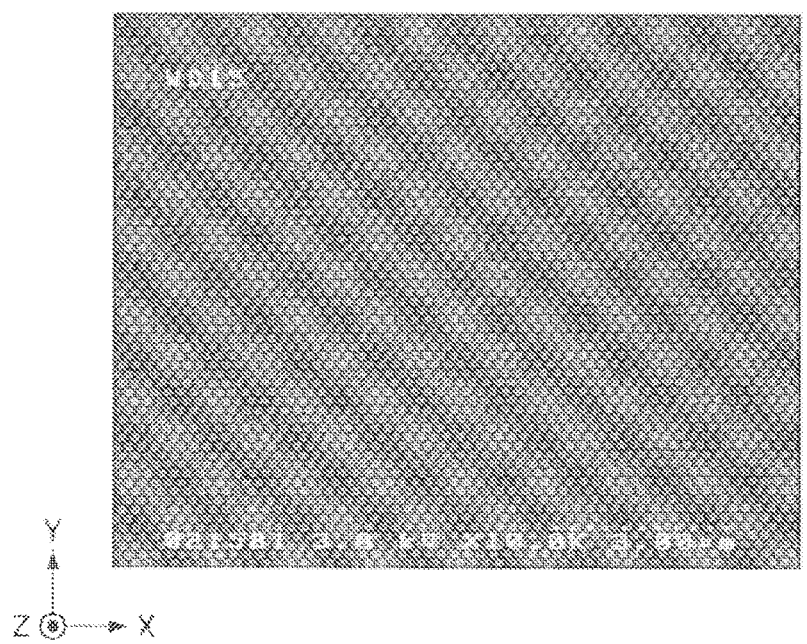
FIG. 9 is a SEM image of a transfer copy according to Example 1 captured at a magnification of 10,000 times.
Figure 10:
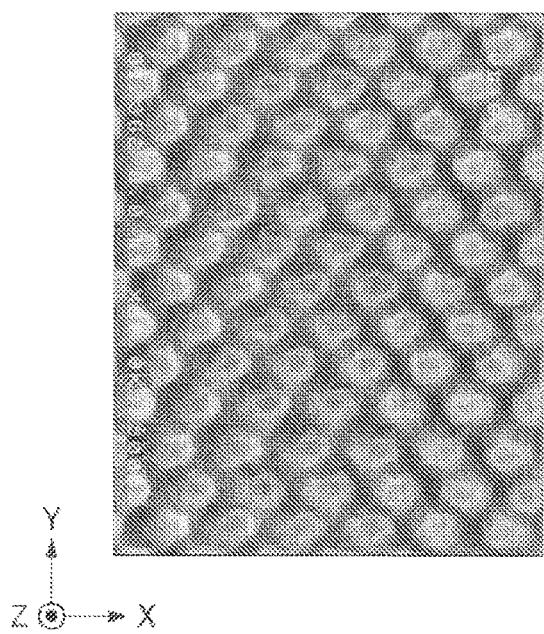
FIG. 10 is a SEM image of the transfer copy according to Example 1 captured at a magnification of 60,000 times.
Figure 11:
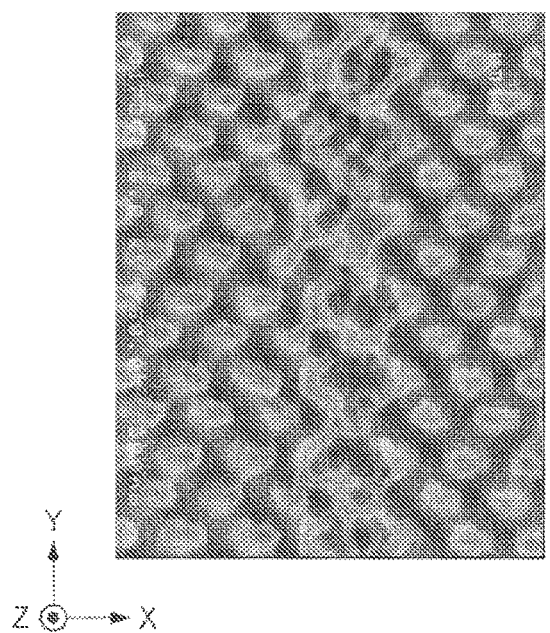
FIG. 11 is a SEM image of a transfer copy according to Comparative Example 1 captured at a magnification of 60,000 times.

The images obtained by observing the transfer receiving bodies manufactured by using the masters according to Example 1 and Comparative Example 1 and captured at a magnification of 10,000 times or 60,000 times with a scanning electron microscope (SEM) are shown in FIG. 9 to FIG. 11. FIG. 9 is a SEM image of the transfer copy according to Example 1 captured at a magnification of 10,000 times. FIG. 10 is a SEM image of the transfer copy according to Example 1 captured at a magnification of 60,000 times. FIG. 11 is a SEM image of the transfer copy according to Comparative Example 1 captured at a magnification of 60,000 times.

In FIG. 9 to FIG. 11, the direction X corresponds to the circumferential direction of the substrate, the direction Y corresponds to the axial direction of the substrate, and the direction Z corresponds to the direction perpendicular to the outer peripheral surface of the substrate. FIG. 10 and FIG. 11 are images of the concave-convex structure in a region exposed upon generation of the start pulse.

FIG. 9 indicates that the master and the transfer copy according to Example 1 do not have, for example, a blank region where the concave-convex structure is not formed, or an error region where the pattern is disordered, but have a concave-convex structure where convexities are continuously arranged in a hexagonal lattice.

The comparison between FIG. 10 and FIG. 11 indicates that the transfer copy according to Comparative Example 1 has convexities arranged in a hexagonal lattice but has an error region where the pattern arrangement is disordered. In Comparative Example 1, the exposure signal is reset at the timing of start pulse generation to invert the phase, and the exposure pattern in a region exposed during that time thus deviates from a desired pattern. Meanwhile, it is indicated that the transfer copy according to Example 1 does not have an error region with a disordered pattern, but has a continuous pattern because the exposure signal is not subjected to resetting or the like at the timing of start pulse generation.

The SEM observation result of the transfer copy according to Comparative Example 2, although not shown, was substantially similar to that of Comparative Example 1. Specifically, the transfer copy according to Comparative Example 2 has convexities arranged in a hexagonal lattice, but has a blank region where no pattern is formed. This is because, in Comparative Example 2, the start position of the exposure signal is controlled by measuring the number of pulses at the timing of start pulse generation, and no exposure pattern is thus formed in a region during that time.

According to an embodiment of the present invention as described above, there can be provided a master having a continuously formed concave-convex structure. The master does not have a blank region where concavities or convexities are not formed in the axial direction of the substrate or an error region where the arrangement of concavities or convexities is disordered. Therefore, according to an embodiment of the present invention, there can be provided a master that offers improved mass production and a method for manufacturing the master. The mass productivity of the transfer copy manufactured by using the master according to the present embodiment can also be improved.

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

REFERENCE SIGNS LIST 1 master
3 exposure apparatus
5 transfer apparatus
10 substrate
12 concave-convex structure
30 laser beam
31 laser source
45 spindle motor
47 control mechanism
48 formatter
49 driver
121 concavities or convexities
400 reference clock generating section
410 first signal generating section
420 second signal generating section
450 waveform generating device

The invention claimed is:

1. A method for manufacturing a master, the method comprising:
    a step of sharing a reference clock between a plurality of signal generating circuits, and generating a rotation control signal and an exposure signal in the plurality of respective signal generating circuits; and
    a step of forming a pattern on an outer peripheral surface of a substrate with a hollow cylindrical shape or cylindrical shape by rotating the substrate about a central axis of the substrate on a basis of the rotation control signal and irradiating the outer peripheral surface of the substrate with a laser beam on a basis of the exposure signal while performing scanning in an axial direction of the substrate,
    wherein a frequency of the rotation control signal is not an integral multiple of a frequency of the exposure signal, and wherein the phase of the exposure signal is inverted by 180° for each rotation.

2. The method for manufacturing a master according to claim 1, wherein, in one rotation of the substrate, a number of pulses from the rotation control signal is an integer, and a number of pulses from the exposure signal is not an integer.

3. The method for manufacturing a master according to claim 1, wherein the rotation control signal is in synchronization with the exposure signal.

4. The method for manufacturing a master according to claim 1, wherein
    the outer peripheral surface of the substrate is provided with a resist layer to be patterned by irradiation with the laser beam, and
    the method further includes a step of forming a concave-convex structure on the outer peripheral surface of the substrate by etching the substrate using, as a mask, the resist layer that has been patterned by irradiation with the laser beam.

5. The method for manufacturing a master according to claim 4, wherein the patterning by irradiation with the laser beam is performed by thermal lithography.

* * * * *